United States Patent
Shen

(10) Patent No.: US 10,317,921 B1
(45) Date of Patent: Jun. 11, 2019

(54) EFFECTIVE CLAMPING IN POWER SUPPLIES

(71) Applicant: NXP USA, Inc., Austin, TX (US)

(72) Inventor: Xianghua Shen, Unterhaching (DE)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/952,583

(22) Filed: Apr. 13, 2018

(51) Int. Cl.
*G05F 1/56* (2006.01)
*H03K 5/24* (2006.01)
*G05F 1/575* (2006.01)

(52) U.S. Cl.
CPC ............. *G05F 1/562* (2013.01); *G05F 1/575* (2013.01); *H03K 5/24* (2013.01)

(58) Field of Classification Search
CPC . G05F 1/56; G05F 1/575; G05F 1/562; G05F 1/565; G05F 1/567; G05F 1/569; G05F 1/571; G05F 1/573; G05F 1/5735
USPC .................................. 323/268–270, 273–281
See application file for complete search history.

(56) References Cited

U.S. PATENT DOCUMENTS

| | | | |
|---|---|---|---|
| 6,362,609 B1 * | 3/2002 | Gailhard ................. | G05F 1/565 323/280 |
| 7,221,213 B2 * | 5/2007 | Lee ......................... | G05F 1/571 323/280 |
| 7,394,307 B2 * | 7/2008 | Negoro .................... | G05F 1/56 257/355 |
| 7,728,569 B1 * | 6/2010 | Le ........................... | G05F 1/575 323/280 |

* cited by examiner

*Primary Examiner* — Nguyen Tran
(74) *Attorney, Agent, or Firm* — Rajeev Madnawat

(57) ABSTRACT

A power supply is disclosed. The power supply includes a first switch and a second switch. The gate of the first switch is coupled to the gate of the second switch. The power supply further includes a cutoff switch coupled between the first switch and an input voltage port. A comparator is included for comparing a voltage at a feedback port with a fixed reference voltage. The comparator opens the cutoff switch when the voltage at the feedback port is lower than the fixed reference voltage.

8 Claims, 2 Drawing Sheets

EFFECTIVE CLAMPING IN POWER SUPPLIES

BACKGROUND

Power supplies are used virtually in every electronic device primarily for converting alternate current (AC) electrical input that may be vary in voltage due to power line conditions and load factors into a constant direct current (DC) output to power the internal circuitry of the electronic device.

There are several types of power supplies such as a linear regulator, a switching regulator and low drop-out regulator (LDO) are used in different applications. A linear regulator is a system used to maintain a steady voltage. The resistance of the regulator varies in accordance with the load resulting in a constant output voltage. The regulating device is made to act like a variable resistor, continuously adjusting a voltage divider network to maintain a constant output voltage and continually dissipating the difference between the input and regulated voltages as waste heat. A switching regulator uses an active device that switches on and off to maintain an average value of output. A low-dropout or LDO regulator is a DC linear voltage regulator that can regulate the output voltage even when the supply voltage is very close to the output voltage.

For certain applications, the voltage regulator is forced into the so-called pass-through mode (PTM) when the input supply voltage is too low for regulation, in which case the output pass device will be fully opened, clamping the output to the input. Large silicon area is often required to fabricate the output pass device to minimize the resistance and reduce the voltage drop across it. Failing to fully open that device will lead to significant silicon area.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a power supply is disclosed. The power supply includes a first switch and a second switch. The gate of the first switch is coupled to the gate of the second switch. The power supply further includes a cutoff switch coupled between the first switch and an input voltage port. A comparator is included for comparing a voltage at a feedback port with a fixed reference voltage. The comparator opens the opens the cutoff switch when the voltage at the feedback port is lower than the fixed reference voltage.

In another embodiment, a method for regulating input voltage in a power supply is disclosed. The proper supply includes a first switch and a second switch in a mirror configuration and a feedback port. The method includes comparing voltage at the feedback port with a fixed reference voltage and if the voltage at the feedback port is lower than the fixed reference voltage, using a cutoff switch, cutting off power supply to the first switch. The mirror configuration includes a gate of the first switch is coupled to the gate of the second switch, a drain of the first switch is coupled to an input power source through the cutoff switch and a source of the second switch is coupled to an output port.

In some examples, the power supply includes a biasing current source coupled to a source of the first switch, and a third switch coupled to a source of the first switch and ground. The feedback port is configured such that the voltage at the feedback port vary proportionately to an output voltage. A second comparator is included and the second comparator is coupled to the feedback port and the fixed reference voltage. The second comparator is configured to control the third switch when the voltage at the feedback port is lower than the fixed reference voltage.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

Note that figures are not drawn to scale. Intermediate steps between figure transitions have been omitted so as not to obfuscate the disclosure. Those intermediate steps are known to a person skilled in the art.

DETAILED DESCRIPTION

Many well-known manufacturing steps, components, and connectors have been omitted or not described in details in the description so as not to obfuscate the present disclosure.

Figure 1:
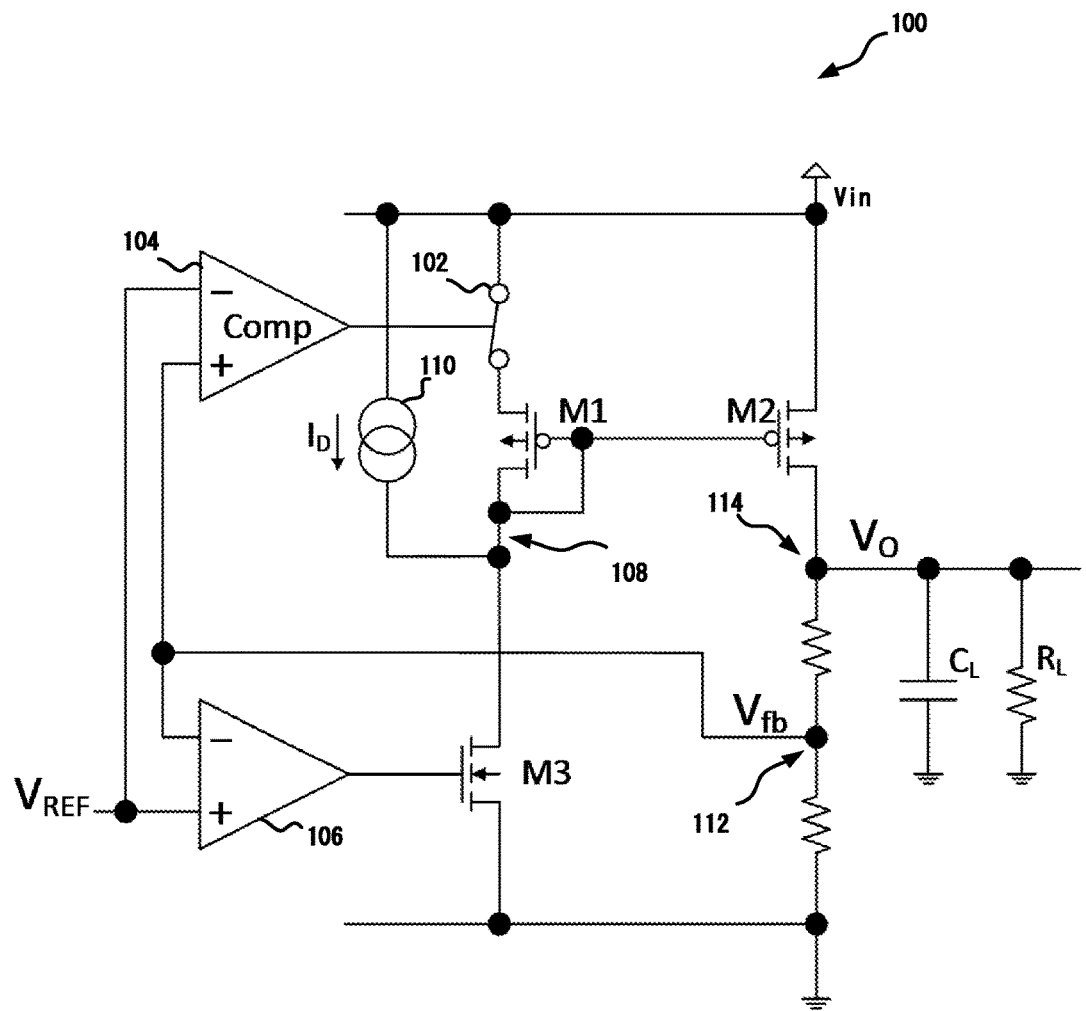
FIG. 1 depicts a schematic diagram of a power supply with a cutoff switch in accordance with one or more embodiments of the present disclosure.

FIG. 1 illustrates a power supply 100 that includes a cutoff switch 102. The power supply 100 also includes a first comparator 104 to control the cutoff switch 102. A first switch M1 and a second switch M2 are included in a mirror configuration to regulate the output voltage $V_o$. The second switch M2 is the main regulator switch that typically occupies the largest space on a semiconductor wafer on which the components of the power supply 100 are fabricated. The source of the first switch M1 is coupled to the cutoff switch 102 in series, that is, when the cutoff switch 102 is open, the source of the first switch M1 is disconnected from supply. The drain and the gate of the first switch M1 are coupled together. The source of the second switch M2 is coupled to the input power supply that is to be regulated. The drain of the second switch M2 is coupled to an output port 114. In some examples, the output port 114 may be coupled to a capacitor $C_L$ and a resistor $R_L$. A feedback port 112 may be included. The feedback port 112 may have a voltage $V_{fb}$ that is inputted to the first comparator 104 and a second comparator 106. The second comparator 106 is coupled to a third switch M3 and the second comparator 106 controls the gate of the third switch M3. A reference voltage $V_{REF}$ is inputted to the second input ports of the first comparator 104 and the second comparator 106.

Biasing current $I_d$ is generated by a biasing current source 110 and inputted to the drain of the third switch M3. The biasing current Id is provided establish predetermined voltages or currents at various points in the power supply 100. The third switch M3 is provided to drive the main output device, e.g., the second switch M2 in the pass-through mode. The pass-through mode occurs when the input supply voltage falls below a selected threshold. In the pass-through mode, wherein the gate of M2 is pulled down by the front regulation stage, M1 needs to be disabled to prevent excessively large current draining into M3. Otherwise the gate voltage of M2 would remain at an elevated level, preventing the switch M2 from being fully opened, which in turn would necessitate a much larger area for silicon fabrication to handled elevated of passing through current.

The power supply 100 is configured to provide a constant output voltage $V_o$. But, when the input supply voltage $V_{IN}$ falls below a selected threshold, the output voltage $V_o$ also falls below another preselected threshold. If the input supply voltage VIN remains above the selected threshold, the output voltage $V_o$ remains constant even when the input supply voltage $V_{IN}$ fluctuates. When $V_O$ falls below the preselected threshold, the feedback voltage $V_{fb}$ at the feedback port 112 falls below the reference voltage $V_{REF}$. When $V_{fb}$ falls below $V_{REF}$, the first comparator 104 turns off the cutoff switch 102, thus cutting of current to the first switch M1. At the same time, the second comparator 106 applies gate voltage at the third switch M3. Cutting of current to the first switch M1 enables pulling the gate of the second switch M2 to close to ground.

Typically, a high value resistor is placed in between the first switch M1 and the third switch M3 at the place shown by the arrow 108. In pass-through modes, the gate of the second switch M2 needs to be pulled down to maximize the output voltage. While a high value resistor at the line 108 could limit the drain current to the third switch M3, the gate voltage of the second switch M2 is held up at a higher value than needed making a much larger size of the switch M2 necessary. In some embodiments, the second comparator 106 may be omitted and an inverted output of the first comparator 104 may be coupled to the gate of the third switch M3. In some examples, the feedback port 112 may be the same as the output port that provides the voltage $V_o$. In other examples, where a lower fixed $V_{REF}$ is used, the feedback port 112 may have a voltage lower than $V_o$.

Figure 2:
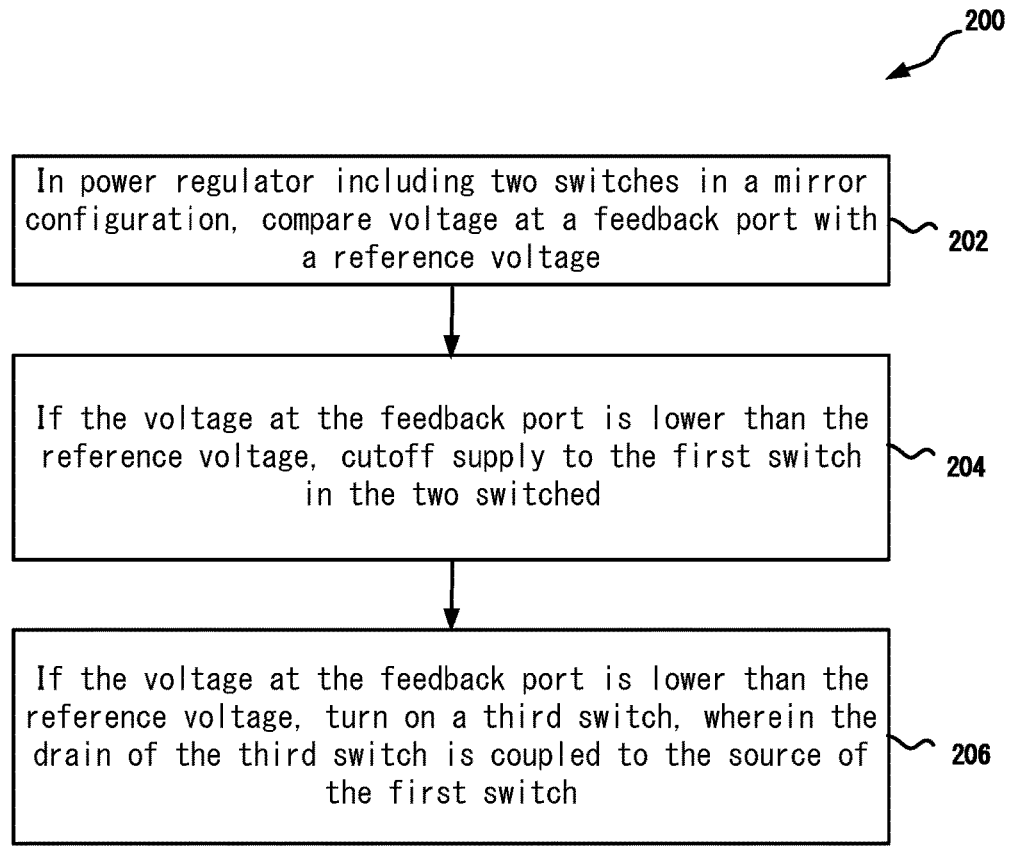
FIG. 2 illustrates a method for cutting off supply to a switch in the plurality of switches in a mirror configuration in accordance with one or more embodiments of the present disclosure.

FIG. 2 illustrates a method 200 for cutting off supply to a switch in the plurality of switches in a mirror configuration. Accordingly, at step 202, voltage at a feedback port is compared, using a comparator, with a fixed reference voltage. At step 204, a determination is made if the voltage at the feedback port is lower than the fixed reference voltage. If so, supply to a switch in the plurality of switched is cutoff using a cutoff switch that is coupled to the drain of the switch being cutoff from the power supply. At step 206, if the voltage at the feedback port is lower than the fixed reference voltage, a third switch that is coupled between the source of the switch being cutoff from power supply and ground, is turned on.

Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A power supply, comprising:
    a first switch including a gate and two other terminals;
    a second switch, wherein the gate of the first switch is coupled to a gate of the second switch;
    a cutoff switch coupled between the first switch and through one of the two other terminals to an input voltage port;
    a comparator for comparing a voltage at a feedback port with a fixed reference voltage, wherein the comparator opens the cutoff switch when the voltage at the feedback port is lower than the fixed reference voltage thereby cutting off power to the first switch, wherein the gate of the first switch and the gate of the second switch are driven independent of opening or closing of the cutoff switch.

2. The power supply of claim 1, further including a biasing current source coupled to a source of the first switch.

3. The power supply of claim 1, further including a third switch coupled to a drain of the first switch and ground.

4. The power supply of claim 1, wherein the voltage at the feedback port vary proportionately to an output voltage.

5. The power supply of claim 3, further including a second comparator coupled to the feedback port and the fixed reference voltage.

6. The power supply of claim 5, wherein the second comparator is configured to control the third switch when the voltage at the feedback port is lower than the fixed reference voltage.

7. The method for regulating an input voltage in a power supply, the power supply including a first switch and a second switch in a mirror configuration and a feedback port, the method comprising:
   comparing voltage at the feedback port with a fixed reference voltage and if the voltage at the feedback port is lower than the fixed reference voltage, using a cutoff switch, cutting off power to the first switch, wherein the mirror configuration includes a gate of the first switch is coupled to a gate of the second switch, a source of the first switch is coupled to an input power source through the cutoff switch and a drain of the second switch is coupled to an output port, wherein the cutting off power to the first switch cuts of power to the first switch through the source of the first switch, wherein the gate of the first switch and the gate of the second switch are driven independent of opening or closing of the cutoff switch.

8. The method of claim 7, wherein the method further including using a third switch to control the gate of the second switch when the voltage at the feedback port is lower than the fixed reference voltage.

* * * * *